(12) United States Patent
Martineau

(10) Patent No.: US 10,749,449 B2
(45) Date of Patent: Aug. 18, 2020

(54) ELECTROACTIVE POLYMER EXPANSION POWER CYCLE

(71) Applicant: Phillip R. Martineau, Salt Lake City, UT (US)

(72) Inventor: Phillip R. Martineau, Salt Lake City, UT (US)

( * ) Notice: Subject to any disclaimer, the term of this patent is extended or adjusted under 35 U.S.C. 154(b) by 177 days.

(21) Appl. No.: 15/882,231

(22) Filed: Jan. 29, 2018

(65) Prior Publication Data

US 2019/0238069 A1   Aug. 1, 2019

(51) Int. Cl.
*H02N 2/18* (2006.01)
*F25B 9/14* (2006.01)
*H01L 41/113* (2006.01)
*F01K 27/00* (2006.01)

(52) U.S. Cl.
CPC ............ *H02N 2/181* (2013.01); *F01K 27/00* (2013.01); *F25B 9/14* (2013.01); *H01L 41/113* (2013.01); *F02G 2243/52* (2013.01); *F05C 2225/08* (2013.01)

(58) Field of Classification Search
CPC .... F02G 2243/52; F05C 2225/08; F25B 9/14; H01L 41/113; H01L 41/193; H02N 2/181; F01K 27/00
USPC ........................................................ 310/307
See application file for complete search history.

(56) References Cited

U.S. PATENT DOCUMENTS

| 7,508,085 | B2 * | 3/2009 | Martineau | H02N 2/18 290/1 A |
| 8,749,081 | B2 * | 6/2014 | Martineau | H02N 2/185 290/43 |
| 2008/0203850 | A1 * | 8/2008 | Martineau | H02N 2/18 310/309 |
| 2016/0114260 | A1 * | 4/2016 | Frick | B01D 3/007 203/12 |
| 2016/0341449 | A1 * | 11/2016 | Bahar | F24H 4/04 |

* cited by examiner

*Primary Examiner* — Alex W Mok

(57) ABSTRACT

Electroactive polymer expansion power cycle (100) converts thermal energy contained in working fluid (20) to electrical energy. Electroactive polymer expansion power cycle (100) comprises a pump (110), a boiler (120), a boiler electroactive polymer reservoir (130), an expansion electroactive polymer reservoir assembly (140), and a condenser (150). The boiler electroactive polymer assembly (140) is comprised of a transducer (10), that generates electricity resulting from the inflation and deflation of the boiler electroactive polymer reservoir (130). Transducer (10) is comprised of one or more polymer spacers (502) sandwiched between one or more top electrodes (504) and bottom electrode (506) pairs. The electroactive polymer assembly (140) is comprised of one or more electroactive polymer reservoirs that are similar in design to the boiler electroactive polymer assembly (130). These electroactive polymer reservoirs generate electricity through the same process as the electricity generated by the boiler electroactive polymer reservoir (140).

16 Claims, 10 Drawing Sheets

ELECTROACTIVE POLYMER EXPANSION POWER CYCLE

BACKGROUND

Prior Art

Figure 1A:
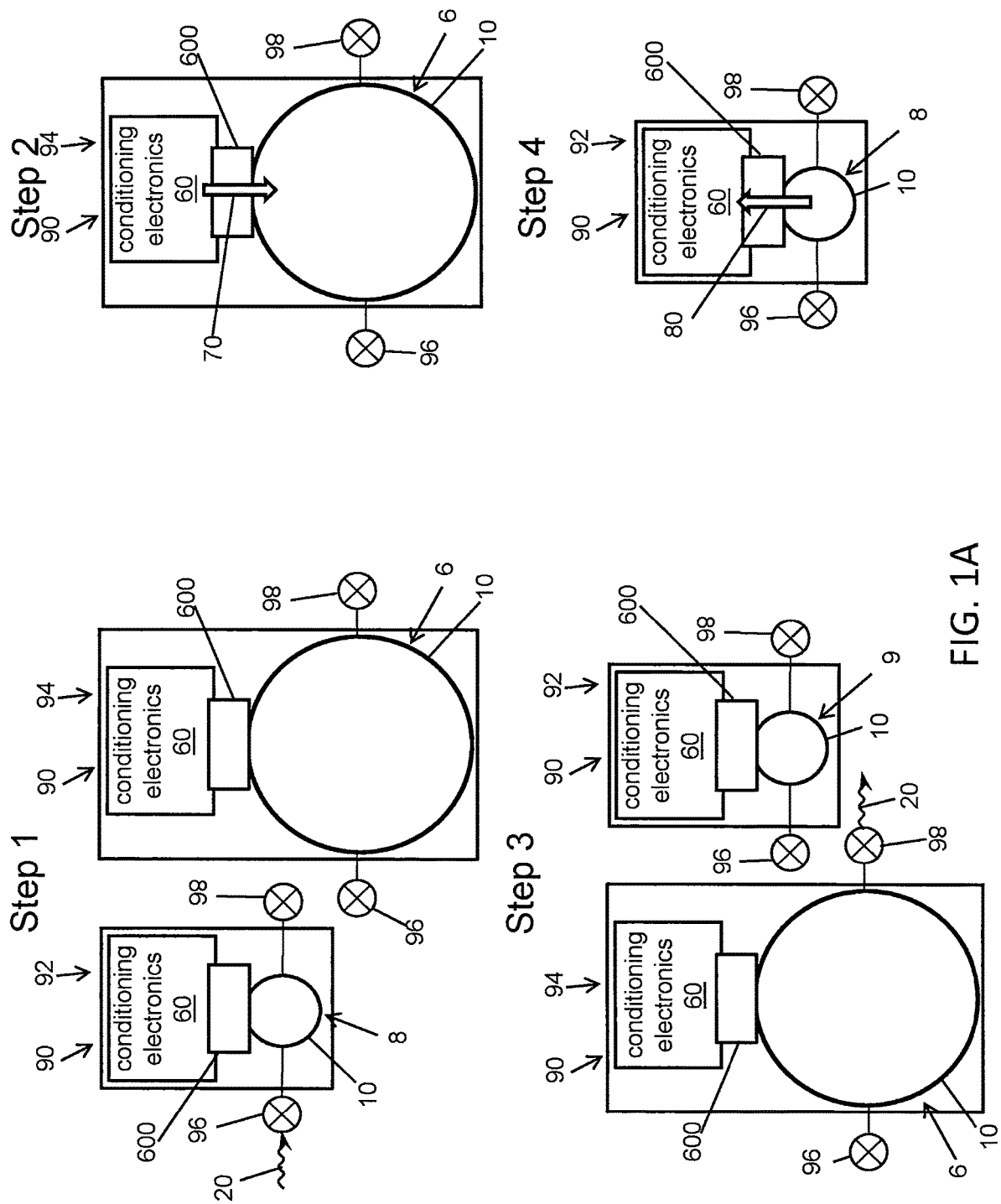

The following is a tabulation of prior art that appear to be relevant

| U.S. Patents | | | |
|---|---|---|---|
| Patent Number | Kind Code | Issue Date | Patentee |
| 9,206,710 | A | 2015 Dec. 8 | Gurin |
| 9,145,795 | A | 2015 Sept. 29 | Lehar |
| 9,115,603 | A | 2015 Aug. 25 | Leibowitz |
| 9,051,852 | A | 2015 Jun. 9 | Geskes |
| 9,021,808 | A | 2015 May 5 | Nelson |
| 9,003,798 | A | 2015 Apr. 14 | Yanagi |
| 8,674,525 | A | 2015 Mar. 18 | Van Den |
| 8,387,386 | A | 2015 Mar. 18 | Schmeltz |
| 8,225,609 | A | 2015 Jul. 24 | Hinderling |
| 7,557,456 | A | 2009 Jul. 07 | Kornbluh |
| 7,508,085 | A | 2009 Mar. 24 | Martineau |
| 7,391,123 | A | 2008 Jul. 24 | Rome |
| 7,368,862 | A | 2008 May 6 | Pelrine |
| 7,049,732 | A | 2006 May 23 | Pei |
| 7,034,432 | A | 2006 Apr 25 | Pelrine |
| 6,982,497 | A | 2006 Jan. 3 | Rome |
| 6,940,211 | A | 2005 Sept. 6 | Pelrine |
| 6,768,246 | A | 2004 Jul. 27 | Pelrine |

| Foreign Patent Documents | | | |
|---|---|---|---|
| Publication Nr. | Cntry Code | Bubl. Date | Applicant |
| 2009144427 | FR | 2008 Dec. 3 | Renault |
| 2010077923 | JP | 2010 Apr. 8 | Hyper Drive |

BACKGROUND

Discussion of Prior Art

The present invention relates generally to Electro Active Polymers (EAP) that convert between electrical energy and mechanical work. More particularly, the present invention relates to EAP and their use in thermodynamic power cycles that convert between thermal and electrical energy from thermal energy sources such geothermal and industrial waste heat.

Thermodynamic power cycles are used to convert thermal energy into mechanical energy. In a power cycle, a working fluid flows through a series of thermodynamic processes to achieve this energy conversion.

An example of this type of cycle is a prior art Stirling cycle. In a Stirling cycle, a working fluid gas cycles through the following thermodynamic processes: isothermal expansion of the high temperature and pressure working fluid gas to a low temperature and pressure state; constant volume heat removal from the low temperature and pressure working fluid gas; isothermal compression of the working fluid from a low temperature and pressure state to low temperature and high-pressure state; and constant volume heat addition to high pressure working fluid to produces a high pressure and temperature gas. In one embodiment, the Stirling cycle is comprised of two cylinders with the working fluid in communication between the two cylinders. The first cylinder is the isothermal expansion cylinder and the second cylinder is the isothermal compression cylinder. A piston is contained within each of these cylinders and the pistons are connected to linkages that are connected to a rotating shaft. The constant volume heat addition and isothermal expansion processes occur in the first cylinder. The constant volume heat removal and isothermal compression processes occur in the second cylinder. During the isothermal expansion process, expansion of the high pressure and temperature working fluid forces the piston down the cylinder from a small volume first position to a large volume second position. The downward movement of the piston causes the piston piston-to-rotating shaft linkage to apply a rotational energy to the rotating shaft. Continuous working fluid cycling through these thermodynamic processes produces continuous rotational energy in the rotating shaft. Typically, the rotating shaft is connected to an electrical generator where the rotational energy is converted to electrical energy.

Electroactive polymer generators also provide a means for converting mechanical energy to electrical energy. Generating electrical energy using electroactive polymer generators is disclosed in U.S. Pat. Nos. 7,557,456, 7,368,862, 7,049,732, 7,034,432, 6,940,211 and 6,812,624. Thermal energy to electrical energy conversion using electroactive polymer generators is disclosed in U.S. Pat. No. 6,628,040.

In one embodiment of the Stirling cycle, electroactive polymer generators are positioned on the isothermal expansion cylinder and the isothermal compression cylinder so that the electroactive polymer generators stretch and relaxes for each rotating shaft rotation. This embodiment is disclosed in U.S. Pat. No. 6,628,040. Work is required to stretch the electroactive polymer generator. This work is recovered and is transferred to the rotating shaft when the electroactive polymer relaxes.

A Stirling cycle is capable of converting thermal energy to mechanical and electrical energy, but nevertheless all Sterling cycles heretofore known suffer from a number of disadvantages:

(a) The machinery required for Sterling cycles are complicated, and as such, require complicated and difficult manufacturing processes.

(b) Because of the Sterling cycles' complexity, they are expensive to manufacture and maintain.

(c) Friction between the sliding components is the cylinders result in wear. This wear makes the Sterling cycle susceptible to wear, and as a result, susceptible to high maintenance cost and short service life.

An additional example of a thermodynamic power cycle is the Rankine cycle. A Rankine cycle includes following components: pump, boiler, turbine and condenser. In a Rankine cycle, the pump compresses the working fluid from a saturated liquid to a high pressure compressed liquid. The compressed liquid flows into the boiler where a high temperature heat source heats the working fluid to a high pressure superheated vapor. The high pressure superheated vapor flow into the turbine. The turbine expands the high pressure superheated vapor working fluid to a low pressure saturated vapor to produce work. The saturated vapor working fluid exits the turbine and enters the condenser. In the condenser, heat is removed from the working fluid, and expelled to the environment, wherein the working fluid is converted to a saturated liquid. The saturated liquid working fluid exits the condenser and flows into the pump to repeat the cycle.

The high temperature heat source provides energy to vaporize the liquid working fluid to a superheated vapor. The portion of the energy in the superheated working fluid that is available for conversion to work is difference in energy between the superheated vapor and the saturated vapor. The portion of energy that is not available for work in difference in energy between the saturated vapor and the saturated liquid. The saturated vapor-to-saturated liquid portion of energy is a majority of the total energy required to convert the working fluid from a saturated liquid to a superheated vapor. This means that the energy available to produce work in the turbine is a minor portion of the high temperature input energy.

The turbine is comprised of a shaft and a housing. The shaft has multiple blades that extend radially outward. The housing covers the shaft and has flow direction paths the force the expanding working fluid to flow over the blades on the shaft. The pressure difference between the turbine inlet high pressure superheated working fluid and turbine exit low pressure saturated vapor produces flow through the turbine. The flow of the working fluid over the shaft blades causes the shaft to rotate. This rotation produces rotational mechanical energy in the thermal-to-mechanical energy conversion. Typically, the shaft is coupled to an electrical generator. The electrical generator converts the rotational mechanical energy to electricity.

In some Rankin power cycles, the working fluid expands beyond the saturated vapor state. In these cycles, a portion of the saturated vapor condenses to saturated liquid droplets. These droplets are entrained in the started vapor. The ratio of vapor mass over the total mass is known is working fluid quality. This expansion beyond the saturated vapor state produces additional thermal-to-mechanical energy conversion. If working fluid quality is too low, damage to the turbine blades and housing flow paths results from impact of droplets on the turbines blades and housing flow paths. This means that the turbine limits the level of working fluid expansion.

Turbines are complex and difficult to manufacture. As a result, turbines are costly and add significant cost to electricity generation. In addition, the electrical generators are complex and difficult to manufacture. Electrical generators are also costly and add significant cost the electricity generation.

In a Rankine power cycle, the efficiency is defined as the work output divided by the input thermal energy. Because the energy available for work is a minor portion of the total input energy, the efficiency is low, less than one. This means a significant portion of cost to provide the high temperature input heat is lost to waste heat.

The heat from the conversion of the working fluid to a saturated liquid, in the condenser, is expelled to the environment as waste heat. A method for increasing the efficiency of a Ranking power cycle is through the conversion of this waste heat to mechanical energy.

Prior art methods for increasing efficiencies rely on recovery of the waste heat from a primary, "top", power cycle as input thermal energy to a, "bottom", power cycle, as disclosed in U.S. Pat. Nos. 9,206,710, 9,145,795, 9,115,603, 9,051,852, 9,021,808 and 9,003,798. The working fluid for these low temperature power cycles is typically a low vaporization temperature organic fluid. The thermodynamic efficiencies of these, "bottom", power cycles are subject to the same limitation as that of the, "top", power cycles. That is, a larger portion of the energy is expelled as waste heat. In addition, because of their low temperatures, the bottom cycle thermodynamic efficiencies are limited to less than 12%. As a result, the overall efficiency gains made possible by additions of bottom power cycles are limited to small fractions of the input thermal energy.

A more efficient means to convert the input thermal energy to useful work would result in lower work energy cost and would be advantageous.

SUMMARY

In accordance with the present invention an electroactive polymer expansion power cycle comprises a pump, a boiler, a boiler electroactive polymer reservoir, an expansion electroactive polymer reservoir assembly and a condenser.

The boiler electroactive polymer reservoir is comprised of a cavity that is formed by a thick wall of elastomeric material. This thick wall of elastomeric material comprises an electroactive polymer generator. In addition, the electroactive polymer reservoir has an in valve and an exit valve. This elastomeric material can sustain strains that range in magnitude from a few percent to as much as several hundred percent. When the in valve is in an opened position, high temperature and pressure vapor working fluid inflates the electroactive polymer reservoir from an uninflated state to an inflated state. Work is required to inflate the electroactive polymer reservoir. This work produces strain energy in the elastomeric wall of the electroactive polymer reservoir. The energy flow into the electroactive polymer reservoir includes the enthalpy contained within the volume of working fluid plus the strain energy in the walls of the electroactive polymer reservoir. After the electroactive polymer reservoir is inflated and the in valve is closed, the energy contained within the electroactive polymer reservoir is the sum of the enthalpy of the working fluid plus the strain energy in the elastomeric walls. After the electroactive polymer reservoir is completely inflated, and low voltage electric charge is placed on the electroactive polymer generator. The exit valve is then opened, and the electroactive polymer reservoir deflates. Working fluid flow from the boiler electroactive polymer reservoir enters the expansion electroactive polymer reservoir assembly.

The expansion electroactive polymer reservoir assembly expands the high temperature and pressure working fluid to a low pressure and temperature saturated vapor and fluid mixture. An expansion electroactive polymer reservoir assembly is comprised of multiple sequential expansion electroactive polymer reservoirs. The expansion electroactive polymer reservoir assembly expands the high temperature and pressure working fluid by sequentially inflating and deflating the expansion electroactive polymer reservoir assembly reservoirs.

An operational example of a one embodiment of an electroactive polymer expansion power cycle is as follows:
1. A working fluid that is pressurized, by a pump, from a low pressure and temperature to a low temperature and high-pressure compressed liquid followed by;
2. a constant pressure heat addition to the working fluid, in the boiler, wherein the heat addition produces a high temperature and pressure vapor working fluid, followed by;
3. inflation of the boiler electroactive polymer reservoir from an uninflated state to an inflated state by flow of the high temperature and pressure vapor working fluid into the boiler electroactive polymer reservoir wherein work is required to inflate the wall of the electroactive polymer reservoir, followed by;

4. a low voltage charge addition to the electroactive polymer generator wall of the of the inflated boiler electroactive polymer reservoir.
5. a deflation process wherein enthalpy of the working fluid and strain energy, in the wall, exits the boiler electroactive polymer reservoir and flows into the first expansion electroactive polymer reservoir of the expansion electroactive polymer reservoir assembly, followed by;
6. inflation of the first expansion electroactive polymer reservoir wherein the first expansion electroactive polymer is inflated with reduced pressure and temperature working fluid vapor and imparted work to the wall of the first expansion electroactive polymer reservoir, followed by
7. a low voltage charge addition to the electroactive polymer generator wall of the first expansion electroactive polymer reservoir, followed by;
8. a continued deflation of the boiler electroactive polymer reservoir and deflation of the first electroactive polymer reservoir by working fluid flow into the second expansion electroactive polymer reservoir, followed by;
9. inflation of the second expansion electroactive polymer reservoir wherein the second expansion electroactive polymer is inflated with additionally reduced pressure and temperature working fluid vapor and imparted work to the wall of the second expansion electroactive polymer reservoir, followed by;
10. a low voltage charge addition to the electroactive polymer generator wall of the second expansion electroactive polymer reservoir, followed by;
11. complete deflation of the boiler electroactive polymer, first expansion electroactive polymer reservoir, and second expansion electroactive polymer reservoir wherein the working fluid exits the deflated reservoirs as a saturate vapor and liquid mixture, followed by;
12. transfer of high voltage electric charges from the boiler, first expansion, and second expansion electroactive polymer reservoirs followed by;
13. flow of the working fluid into the condenser, wherein the working fluid is condensed into a saturated liquid, followed by;
14. flow or the saturated liquid working fluid into the pump where the working fluid repeats the cycle.

The work to inflate the boiler electroactive polymer reservoir wall is substantially reversible. This means the magnitude of the work to stretch the reservoir wall during inflation is substantially the same as the magnitude of the work that is recovered when the reservoir wall is relaxed during deflation. The recovered work forces the working fluid out of the reservoir during deflation. This recovered work is then transferred to the walls of the expansion electroactive polymer reservoirs as the expansion reservoirs are inflated.

The residence time of the working fluid in the expansion electroactive polymer reservoirs, of the expansion electroactive polymer reservoir assembly, is small. This means that there is substantially no energy loss due to heat conduction from the working fluid. In addition, in and exit valve flow losses in the working fluid flow is very low and, as a result, substantially zero. Because heat conduction and flow energy losses are low and substantially zero, expansion of the working fluid, in the expansion electroactive polymer reservoir assembly is substantially an isentropic process.

The example above describes one embodiment where there are two expansion electroactive polymer reservoirs. Other embodiments could include only a boiler electroactive polymer reservoir, with no expansion reservoirs, only one expansion reservoir or more than three reservoirs.

DRAWINGS

Figures

Figure 1B:
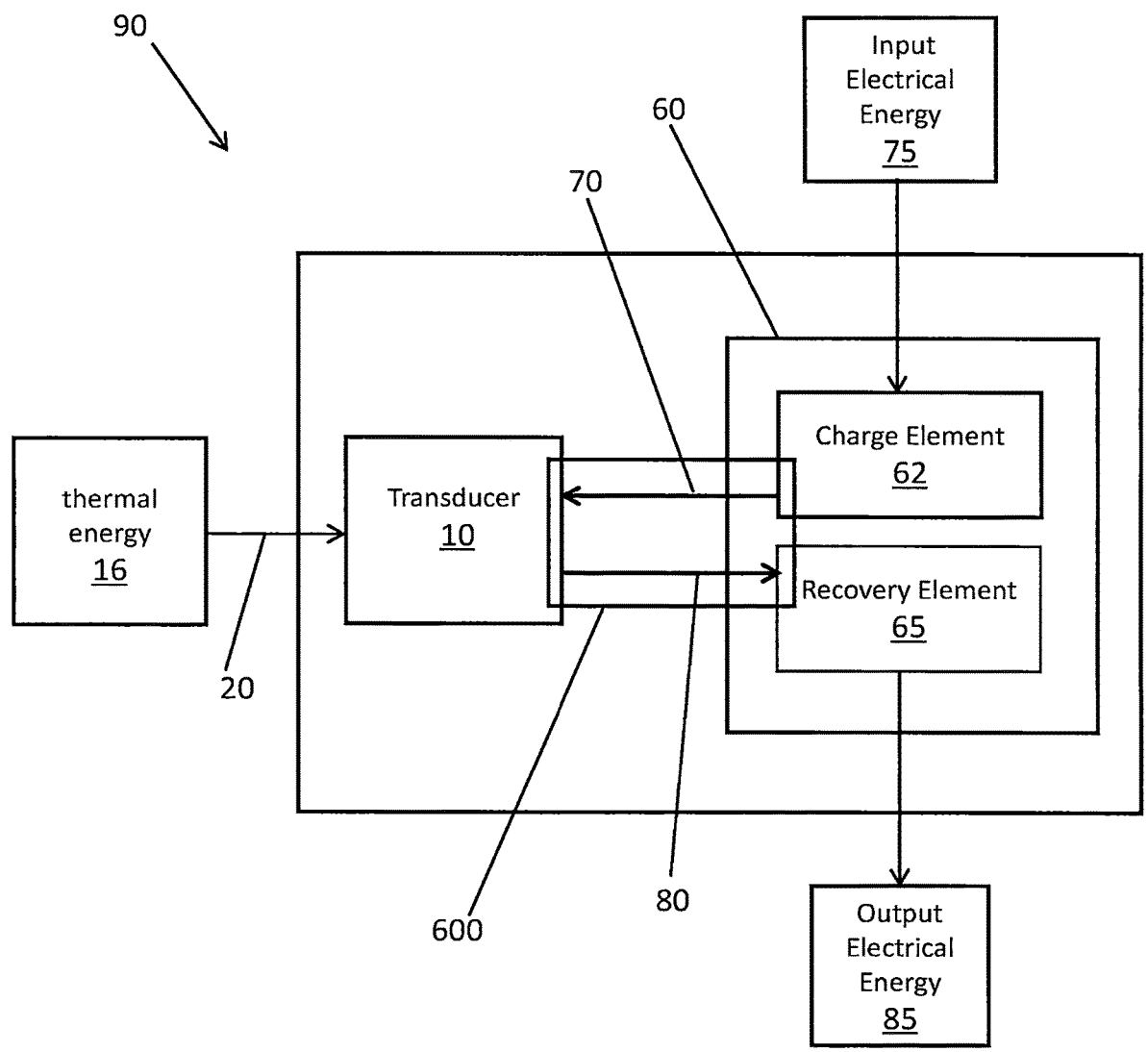
Figure 2:
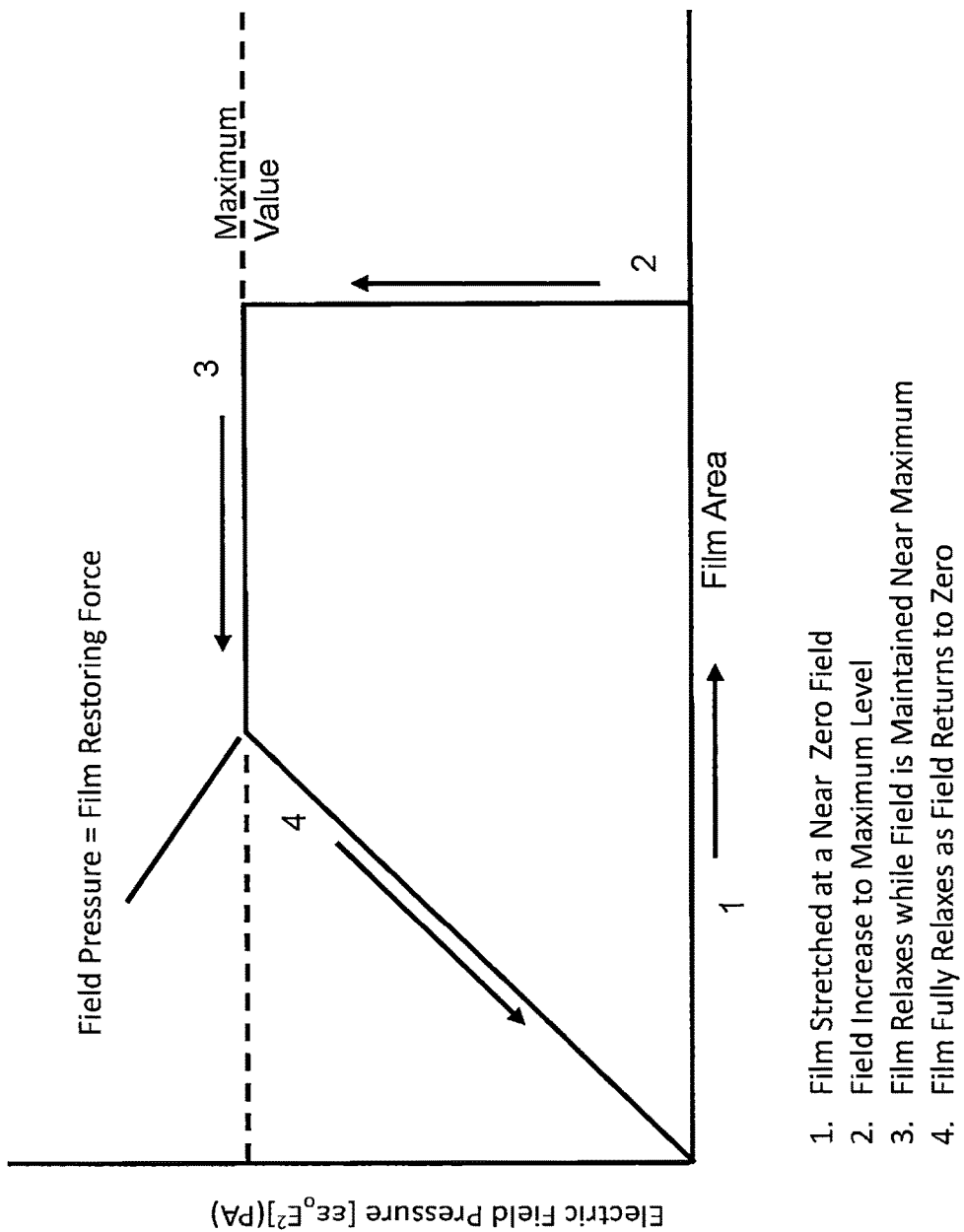
Figure 3A:
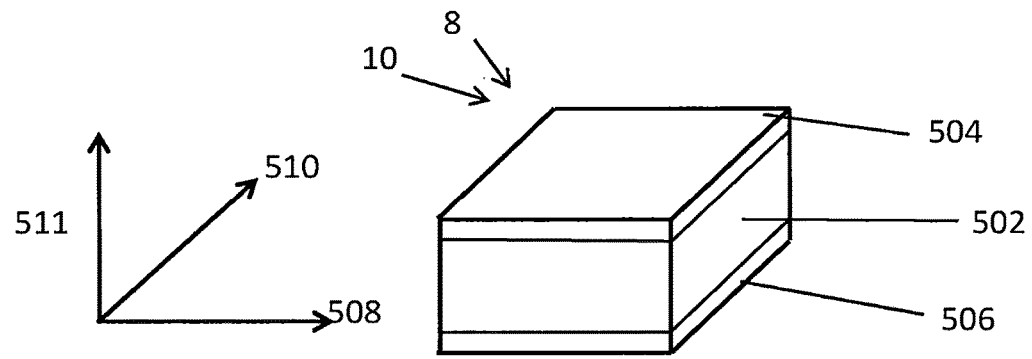
Figure 3B:
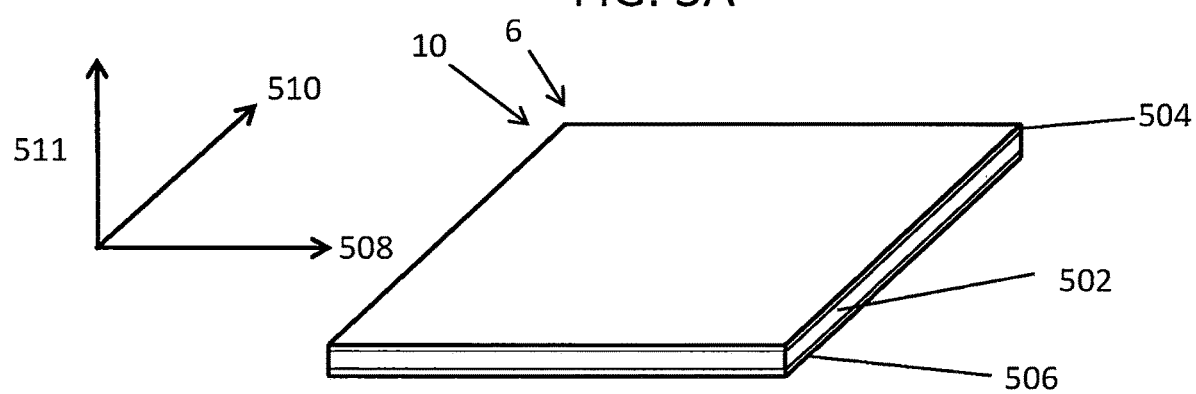
Figure 3C:
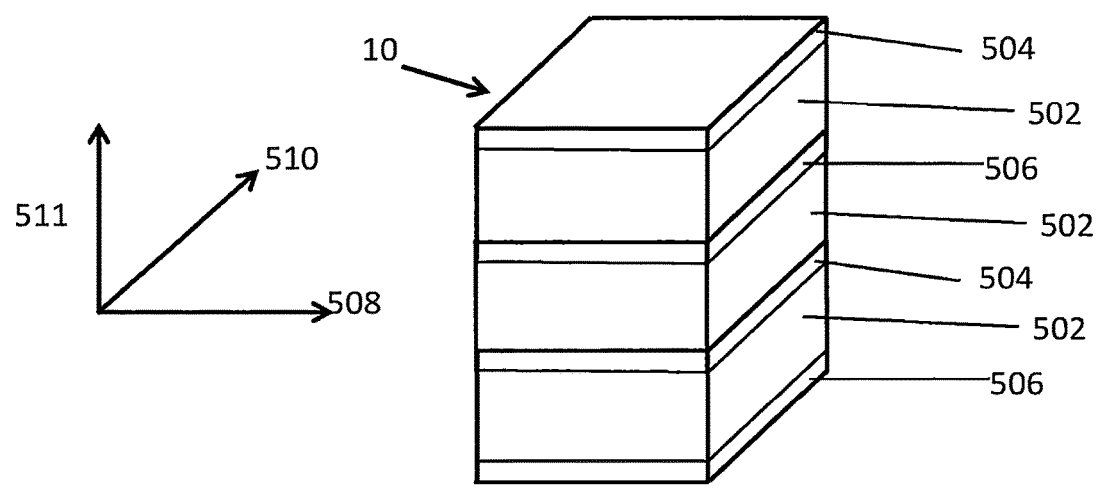
Figure 4:
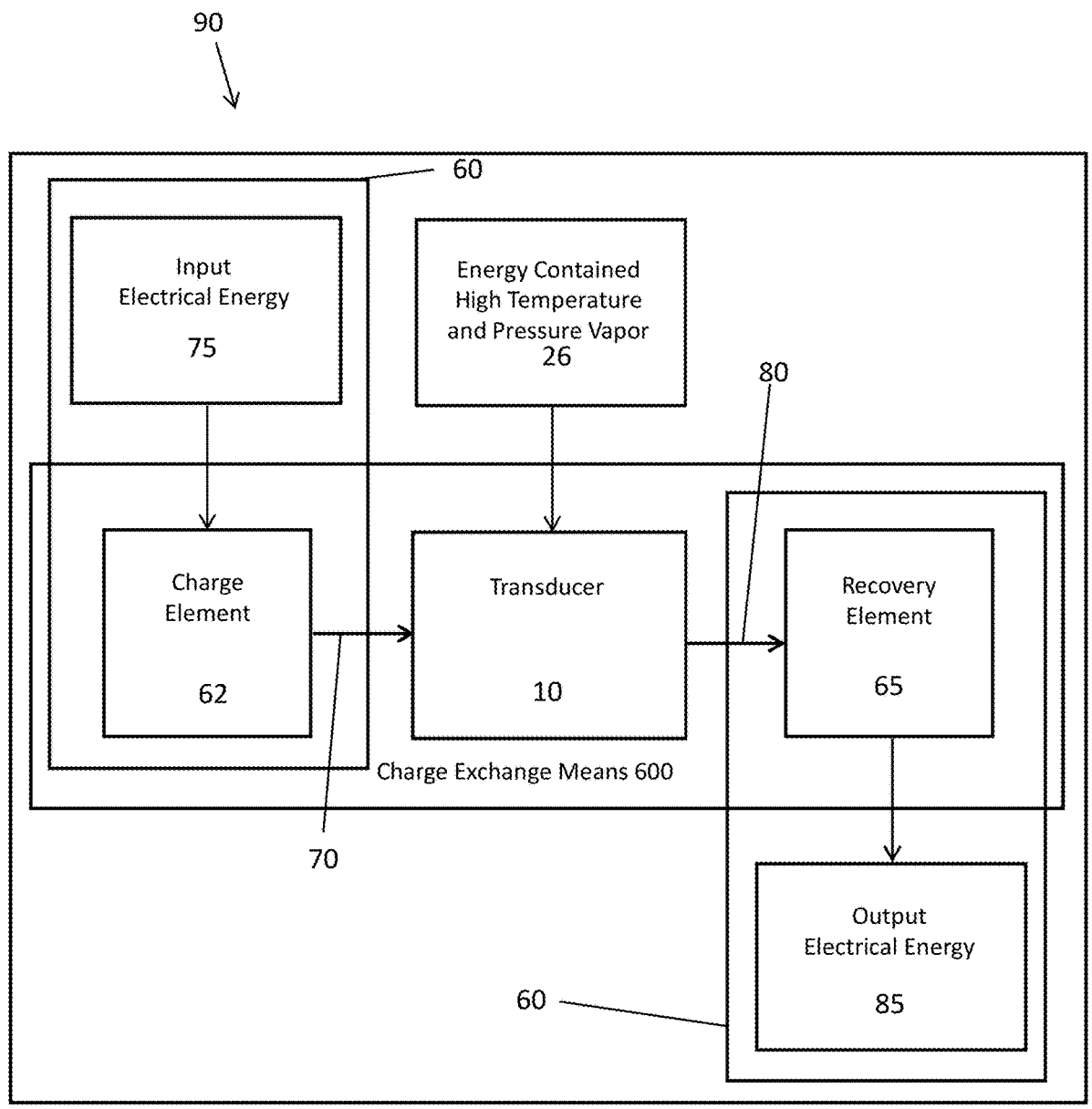
Figure 5A:
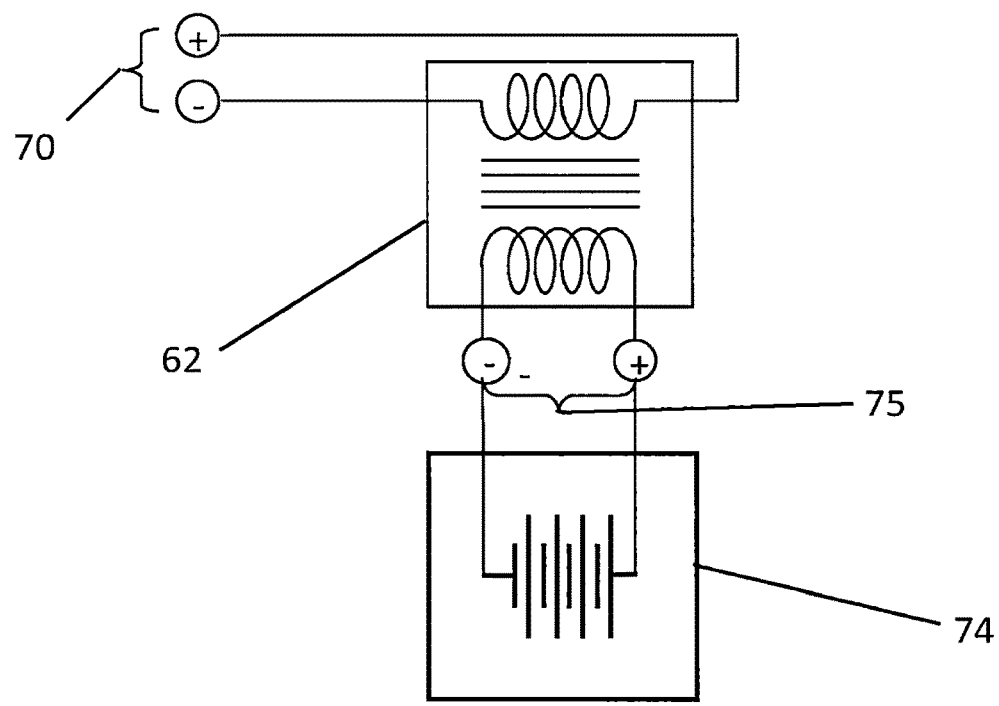
Figure 5B:
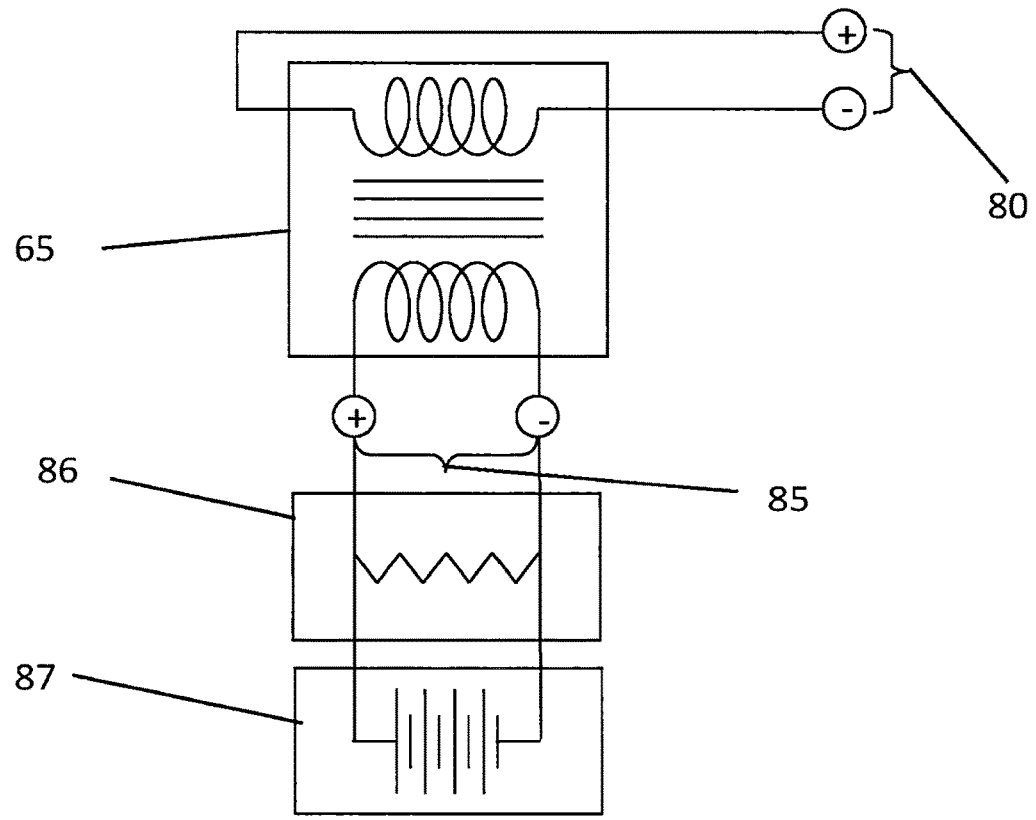
Figure 6:
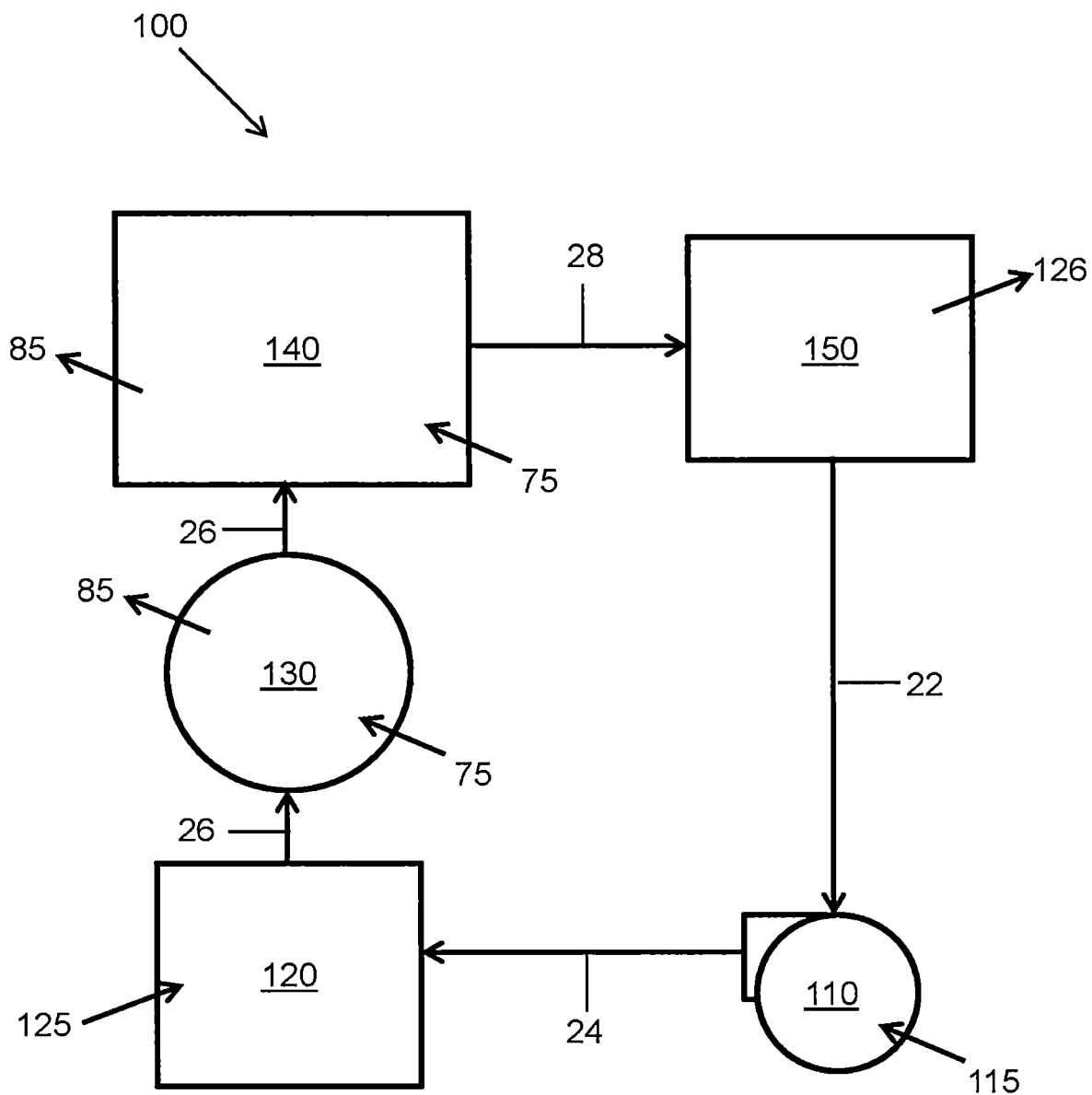
Figure 7A:
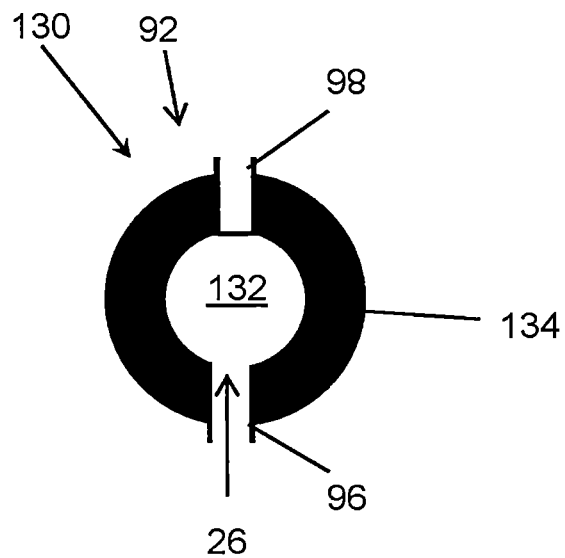
Figure 7B:
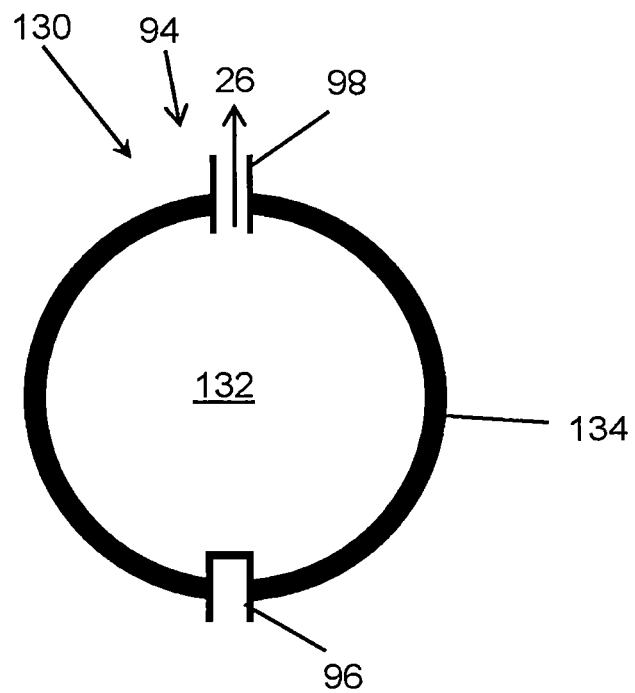
Figure 8A:
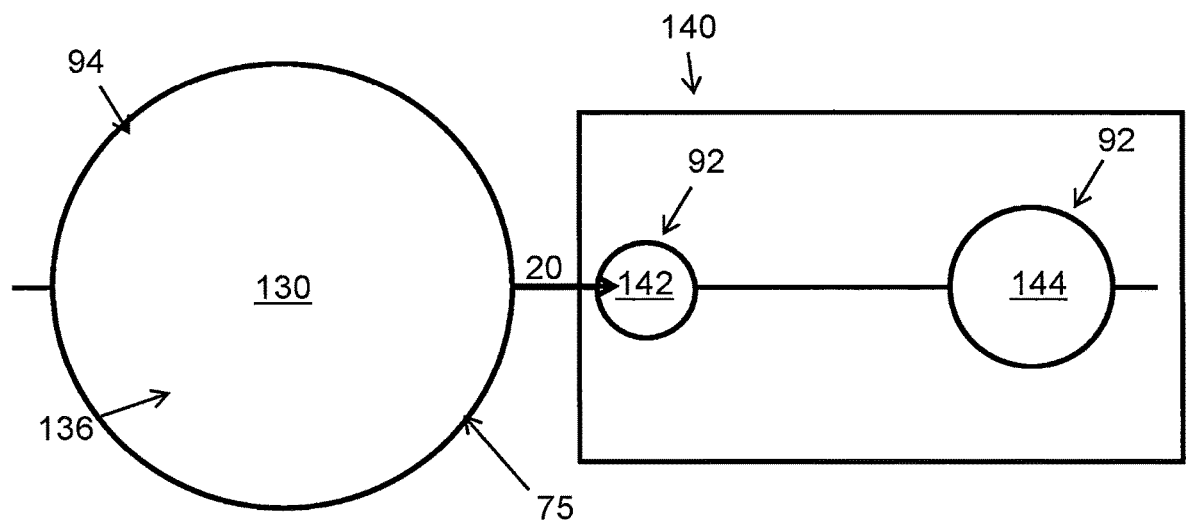
Figure 8B:
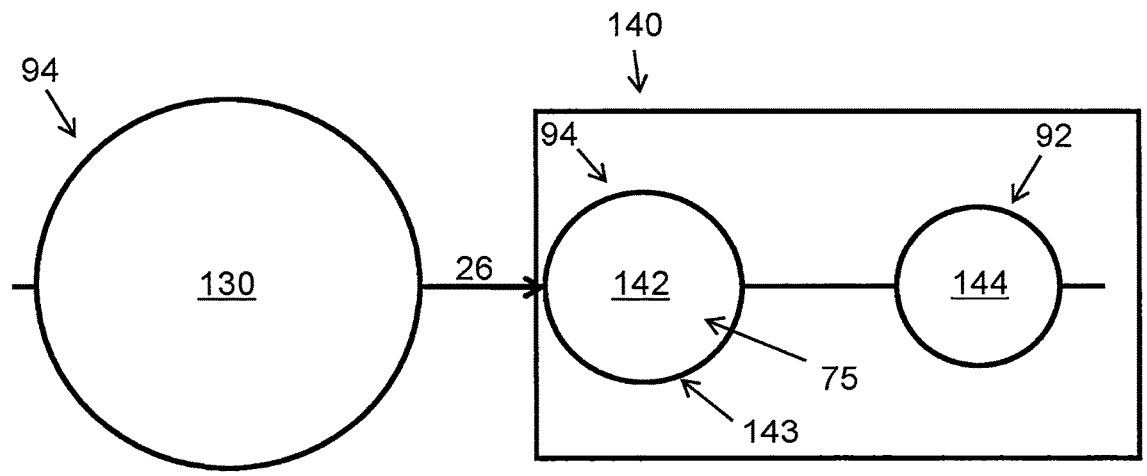
Figure 8C:
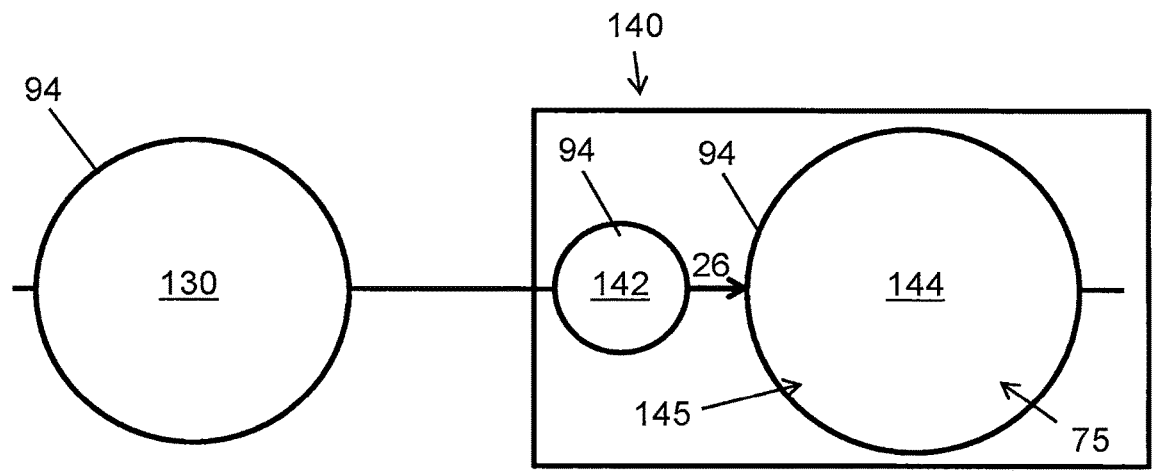
Figure 8D:
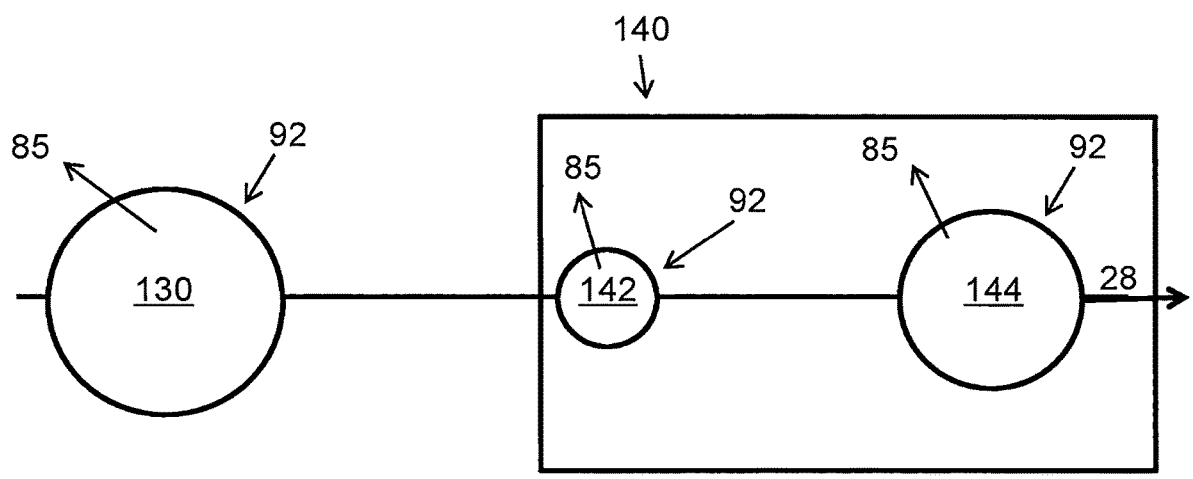

FIG. 1A shows a four-step method for an electroactive polymer reservoir to convert thermal energy to electrical energy.
FIG. 1B shows a block diagram for a method to convert the thermal energy to electrical energy.
FIG. 2 describes a four steps electroactive polymer energy generation cycle.
FIG. 3A shows a transducer in a relaxed state.
FIG. 3B shows a transducer in a stretched state.
FIG. 3C shows a transducer with multiple layers in a relaxed state.
FIG. 4 shows a block diagram of a charge exchange means.
FIG. 5A shows diagram for a charge element and a constant voltage power supply.
FIG. 5B shows a diagram for a recovery element with electric transmission device or electric energy storage device.
FIG. 6 shows a preferred embodiment of a strain augmented power cycle.
FIG. 7A shows a cross section an uninflated boiler electroactive polymer reservoir.
FIG. 7B shows a cross section of an uninflated boiler electroactive polymer reservoir.
FIG. 8A shows an example of boiler electroactive polymer reservoir in an inflated position with an expansion electroactive polymer assembly.
FIG. 8B shows a first expansion of an expansion reservoir.
FIG. 8C shows a second expansion of an expansion reservoir.
FIG. 8D show deflation of a boiler electroactive polymer reservoir and an expansion reservoir assembly.

DRAWINGS

Reference Numerals

| | | | |
|---|---|---|---|
| 6 | stretched state | 8 | relaxed state |
| 9 | equilibrium state | 10 | transducer |
| 20 | working fluid | 22 | saturated liquid |
| 24 | compressed liquid | 26 | high temperature and pressure vapor |
| 28 | saturated vapor | 60 | condition electronics |
| 62 | charge element | 65 | recovery element |
| 70 | low voltage charge | 75 | input electrical energy |
| 77 | input voltage | 78 | output voltage |
| 80 | high voltage charge | 85 | output electrical energy |
| 90 | electroactive polymer reservoir | 92 | uninflated position |
| 94 | inflated position | 96 | in valve |
| 98 | exit valve | 100 | electroactive polymer expansion power cycle |
| 110 | Pump | 115 | input work |
| 120 | boiler | 125 | high temperature input thermal energy |
| 130 | boiler electroactive polymer reservoir | 132 | cavity |
| 134 | elastomeric wall | 136 | boiler reservoir inflation work |
| 140 | expansion electroactive polymer reservoir assembly | 142 | first expansion reservoir |

-continued

| 143 | first expansion reservoir work | 144 | second expansion reservoir |
| 145 | second expansion reservoir work | 150 | condenser |
| 502 | polymer spacer | 504 | top electrode |
| 506 | bottom electrode | 508 | first axis |
| 510 | second axis | 511 | third axis |
| 600 | charge exchange means | | |

OBJECTS AND ADVANTAGES

Accordingly, several objects and advantages of my invention are:

(a) To provide a thermodynamic power cycle for efficiently converting thermal energy to electric energy which can be used with high and low temperature thermal energy sources and multiple working fluids.

(b) To provide an electroactive polymer generator expansion device for expanding working fluid from high temperature and pressure heated vapors to saturated vapors and saturated liquids which can be used with low quality vapor working fluid.

(c) To directly convert thermal energy to electric energy using electroactive polymer generators without the need for an electrical generator. Further objects and advantages of my invention will become apparent from a consideration of the drawings and ensuing description.

DETAILED DESCRIPTION OF THE PREFERRED EMBODIMENTS

The following detailed description of the present invention is provided with respect to a few preferred embodiments. This description provides a thorough understanding of the present invention through discussion of specific details of these preferred embodiments. To those skilled in the current art, it will be apparent that the present invention can be practiced with variations to the preferred embodiments, with or without some or all of these specific details. Well known processes, steps, and/or elements have not been described in order to focus on, and not obscure, those elements of the present invention.

Electroactive Polymer Reservoir Thermal Energy Conversion—FIGS. 1A, 1B

FIG. 1A shows a four-step method for an electroactive polymer reservoir 90 to convert thermal energy contained in working fluid 20 to electrical energy. The electroactive polymer reservoir 90 comprises transducer 10, condition electronics 60, charge exchange means 600 in valve 96 and exit valve 98. The method described below is for illustrative purposes only. There are other methods that could be used, and the method described herein is only one of the possible methods.

In Step 1, the electroactive polymer reservoir 90 is in uninflated position 92 and transducer 10 is in relaxed state 8. Working fluid 20 flows through the in valve 96 into electroactive polymer reservoir 90 that is in an uninflated position 92. This flow causes the uninflated electroactive polymer reservoir 90 to move to an inflated position 94. When electroactive polymer reservoir 90 is in the inflated position 94, transducer 10 is in stretched state 6. Work is required to change transducer 10 from relaxed state 8 to stretched state 6 when the electroactive polymer reservoir 90 moves from the uninflated position 92 to the inflated position 94. This work produces strain energy in transducer 10.

Step 2 is the transfer of low voltage charge 70 to transducer 10 is in stretched state 6. Low voltage charge 70 is transferred from conditioning electronics 60 to transducer 10 by charge exchange means 600.

Step 3 starts after low voltage charge 70 is transferred to transducer 10. After low voltage charge 70 is transferred to transducer 10, working fluid 20 flows from electroactive polymer reservoir 90, through exit valve 98, and electroactive polymer transducer reservoir 90 returns to uninflated position 92. This causes transducer 10 to move to equilibrium state 9 and transfers the strain energy to the electrical energy by transforming low voltage charge 70 to high voltage charge 80.

Step 4 is the transfer of high voltage charge 80 from transducer 10 to conditioning electronics 60 by charge exchange means 600. Transducer 10 returns to relaxed state 8 when high voltage charged is transferred form transducer 10.

The transfer of high voltage charge 80 to conditioning 60 electronics completes the method for converting thermal energy, contained in working fluid 20, to electrical energy in the form of high voltage charge 80. The high voltage charge 80 is transformed to output electrical energy 85 in a usable from by conditioning electronics 60. The usable form of the output electrical energy 85 is typically in the form of a lower voltage that can be stored in conventional batteries or transferred to an electrical grid.

FIG. 1B shows a block diagram for the method to convert the thermal energy 16 to electrical energy. Thermal energy 16 inputs to the electroactive polymer reservoir 90 can include but are not limited to working fluid 20 that is in a high pressure and temperature state, saturated vapor state or a mixture of saturated vapor and saturated liquid state and input electrical energy 75. The output from the electroactive polymer reservoir 90 is the output electrical energy 85. The output electrical energy 85 is greater than input electrical energy 75 because electroactive polymer reservoir 90 converts the thermal energy in working fluid 20 to electrical energy. This converted thermal energy, combined with input electrical energy 75, produces output energy 85.

Flow of working fluid 20 into transducer 10 stretches transducer 10. When transducer 10 reaches a stretched state, low voltage electric charge 70 is transferred to transducer 10, by a charge exchange means 600, from conditioning electronics 60 charge element 62. The charge element 62 transforms input electrical energy 75 to the voltage required for low voltage charge 70. After addition of input electrical energy 75, working fluid 20 is removed from transducer 10. The transducer 10 relaxes, transforming low voltage charge 70 to high voltage charge 80. The high voltage charge 80 is transferred from transducer 10 by charge transfer means 600 to recovery element 65 of conditioning electronics 60. The recovery element 65 transforms high voltage charge 80 from the high voltage to the voltage required for output electrical energy 85.

The method described above represents one embodiment for using electroactive polymer generators to transform energy contained in the moving fluid to electrical energy. This embodiment is one of many possible embodiments and should not be consider as inclusive of all embodiments.

Energy Recovery Cycle To Generate Electricity—FIG. 2

The one or more transducers 10 of electroactive polymer reservoir 90 proceeds through an energy recovery cycle to generate electricity. Transducer 10 is comprised of a thin film of elastomeric material coated with a material that can accept electric charges. The energy recovery cycle shown in FIG. 2 describes the four steps described above. This cycle is shown for illustrative purposes only. Many different cycles could be employed for the present invention.

A representative energy recovery cycle is comprised of four steps. In Step 1 an electroactive polymer film contains low electric field pressure and a mechanical force pulls the film to a stretched configuration. In Step 2, electric charge is transferred to the film increasing the electric field pressure on the film to a maximum value. In Step 3 the film is relaxed, to where the restoring force of the stretched film equals the external force from the electrical field pressure. The electric field pressure remains near its maximum value. As the electroactive polymer film relaxes, the electrical energy on the film increases because the electroactive polymer film restoring force returns the film to near its original thickness. The electrical energy increase is manifest in the form of a voltage increase. The increase in the charge's energy is harvested in the form of electric current flow. In Step 4 the electroactive polymer film fully relaxes as the electric field pressure is reduced to near zero and all of the electrical energy is recovered.

Electroactive Polymer Transducers—FIGS. 3A, 3B, 3C

FIG. 3A shows the transducer 10 in relaxed state 8. FIG. 3B shows the transducer 10 in the stretched state 6. Transducer 10 is comprised of a top electrode 504, a bottom electrode 506 and a polymer spacer 502. The polymer spacer 502 is placed between top electrode 504 and bottom electrode 506. Top electrode 504 and bottom electrode 506 are affixed to polymer spacer 502. Polymer spacer 502 is an elastomeric material that is an electrical insulator with dielectric properties. Top electrode 504, and bottom electrode 506 are comprised of elastomeric electrically conductive materials or a conductive grease.

FIG. 3C shows alternating layers of the top electrode 504, followed by a polymer layer 502, followed by bottom electrode 506, followed by a spacer 502, followed by a top electrode 504 and continuing. The alternating layers form multiple transducer layers. Transducer 10 can comprise a single transducer layer or multiple layers.

Transducer 10 functions as a variable capacitor. A capacitor is two conducting electrodes separated by a dielectric, electrically insulating medium. One of the electrodes corresponds to top electrode 504. The other electrode corresponds to bottom electrode 506. The dielectric, electrically insulating medium corresponds to polymer spacer 502. The capacitance C of a capacitor can be described as $C = \varepsilon^\circ k A/T$. Where $\varepsilon^\circ$ is the electrical permittivity constant, k is the dielectric constant of the nonconducting medium, A is the area of the capacitor and T is the thickness of the nonconducting medium. The capacitance of a capacitor is proportional to the electrode surface area divided by the distance between the electrodes. Placement of a dielectric material between the electrodes increases the capacitance. Increasing the electrode surface area and reducing the distance between the electrodes increases the capacitance. Conversely, reducing the electrode surface area and increasing the distance between the electrodes reduces the capacitance.

FIG. 3A and FIG. 3B show a means by which transducer 10 converts mechanical energy to electrical energy. FIG. 3A shows transducer 10 in relaxed state 8. In FIG. 3B, transducer 10 is stretched by inflation of electroactive polymer reservoir 90 to a larger area in a plane defined by first axis 508 and second axis 510 and thinner in the direction defined by third axis 511. An electric charge is applied to electrodes 504 and 506 of transducer 10 in stretched state 6. The applied charge results in a voltage difference between electrodes 504 and 506. Transducer 10 of electroactive polymer reservoir is nonplanar. However, the thickness of transducer 10 is small compared to the nonplanar characteristics and as a result can be closely approximated as planar The resulting electrostatic force is insufficient to balance the elastic restoring force of polymer spacer 502 in transducer 10 during deflation of electroactive polymer reservoir 90. As electroactive polymer reservoir 90 returns do deflated position 92, transducer 10 contracts to a smaller planar area in directions 508 and 510 and becomes thicker in direction 511 as shown in FIG. 3A. Reducing the planar area in directions 508 and 510 and increasing the distance between electrodes 504 and 506 reduces the capacitance and as a result, raises the electrical energy and voltage of the charge. That is, mechanical deflection is turned into electrical energy and transducer 10 is acting as a generator.

The increase in electric energy, U, can be illustrated by $U = 0.5 Q^2/C$, where Q is the amount of electric charge on the electrodes and C is the capacitance. If Q is fixed and C decreases, the electrical energy U increases.

The increase in electrical energy in the form of increased voltage can be recovered and stored or used. Thus, transducer 10 converts mechanical energy to electrical energy when it contracts. Some or all of the charge can be removed when transducer 10 is fully contracted.

If the electric field pressure in the polymer increases and reaches balance with the mechanical elastic restoring force and external load during contraction, the contraction will stop before full contraction, and no further elastic mechanical energy will be converted to electrical energy. Removing some of the charge reduces the electrical filed pressure, thereby allowing contraction to continue. Thus, removing some of the charge may further convert mechanical energy to electrical energy. The exact electrical behavior of transducer 10 when operating as a generator depends on the electrical and mechanical loading as well as the intrinsic properties of polymer spacer 502 and electrodes 504 and 506.

Many polymers are commercially available for use as transducer materials. The materials used in transducer applications can have linear strain capacities of at least one hundred percent. Further, some of these materials can have linear strain capacities between two hundred and four hundred percent. Linear strain is defined, in this application, as the deflected distance per relaxed length along the direction of applied load. The deflected distance is the difference between the stretched length and relaxed length. It is also desirable that these materials are reversible over the range of strain. In other words, it is preferred that they return to their relaxed length after the applied load is removed. Some of the materials that are currently available include: silicone elastomers, thermoplastic elastomers, acrylic elastomers, polyurethanes and fluoroelastomers. This list is not intended to cover all possible suitable transducer materials and is provided as examples to show possible materials. There are many other possible transducer materials.

Various types of electrode materials suitable for use in the present invention are described by Pelrine et al. in U.S. Pat. No. 6,768,246. Materials suitable for use in an electrode for the present invention include; graphite, carbon black, thin metals such as gold and silver, gel and polymer grease suspended metals, graphite, or carbon and conductive grease.

Electrical Circuits—FIG. 4, FIG. 5A, FIG. 5B

In the present invention input electrical energy 75 and energy contained in high temperature and pressure vapor 26 in electroactive polymer reservoir 90 is applied to transducer 10 in a manner that allows output electrical energy 85 to be greater than input electrical energy 75. The strain energy to electrical energy conversion generally requires charge exchange to and from transducer 10 to coincide with the stretched state 6 and relaxed state 8.

FIG. 4 shows a block diagram of charge exchange means 600 of electroactive polymer reservoir 90. Input electrical energy 75, in the form of low voltage charge 70, is transferred to transducer 10 in stretched state 6 through charge element 62 of conditioning electronics 60. Transducer 10 is in stretched state 6 because electroactive polymer reservoir 90 is in inflated position 94. After addition of input electrical energy 75, electroactive polymer reservoir 90 returns to uninflated position 92 and transducer 10 returns to relaxed state 8. When transducer 10 returns to relaxed state 8, low voltage charge 70 transforms to high voltage charge 80. High voltage charge 80 flows through recovery element 65. Recovery element 65 of conditioning electronics 60 converts high voltage charge 80 to output electrical energy 85. Charge exchange means 600 controls the flow of input electrical energy 75 through charge element 62 to transducer 10. Charge exchange means 600 also controls flow of output electrical energy 85 through recovery element 65.

FIG. 5A shows a representative diagram for charge element 62 combined with a constant voltage power supply 74. The constant source power supply 74 provides input electrical energy 75 to charge element 62. The constant source power supply 74 can be a battery or electrical circuitry that takes input power from an external electrical energy source and produces input electrical energy 75. The charge element 62 can be step-up circuitry that is configured to produce low voltage charge 70 from input electrical energy 75. To achieve efficient energy recovery, low voltage charge 70 is in a range of 1000 to 3000 volts. At these voltages, with the dielectric constants of current electroactive polymers, the relaxed thickness of polymer spacer 502 is in a range of 0.1 to 2.5 millimeters. Descriptions of representative step up circuitry can be found in U.S. Pat. Nos. 7,557,456 and 6,768,246.

FIG. 5B shows a representative diagram for recovery element 65 combined with electric transmission device 86 or electric energy storage device 87. Recovery element 65 of the present invention can be comprised of a step-down circuit. The high voltage charge 80 is reduced to the voltage for output electric energy 85 by recovery element 65. The output electric energy 85 flows to the electric energy storage device 87 or electric transmission device 86. The electric energy storage device 87 can be a battery, storage capacitor or any other device that is appropriate for storing electrical energy. The electric transmission device 86 can be any device that adds the electric energy to the electricity transmission grid. Descriptions of representative step-down circuitry can be found in U.S. Pat. Nos. 7,557,456 and 6,768,246.

The circuits, of electroactive polymer reservoir 90, are not limited to those describe above. The variation of these circuits can depend on the configuration of electroactive polymer reservoir 90.

To understand electroactive polymer reservoir 90, operational parameters at two times $t_1$ and $t_2$ can be compared. At $t_1$, transducer 10 possesses capacitance $C_1$, and input voltage 77 $V_B$. The input voltage 77, $V_B$ can be provided by the charge element 62. At a later time t2, capacitance $C_2$ of transducer 10 is lower than capacitance $C_1$. Generally speaking, the higher capacitance $C_1$ occurs when the transducer 10 is in the stretched state 6, and the lower capacitance $C_2$ occurs when transducer 10 is in the relaxed state 8. The capacitance of a capacitor can be estimated by well-known formulas relating the capacitance to the area, thickness, and dielectric constant.

Typically, electroactive polymer reservoir 90 operates at a particular voltage, $V_O$. The output voltage 78, $V_2$ that appears on the transducer 10 at time, $t_2$ may be approximately related to charge $Q_1$ on the transducer 10 at $t_1$ as:

$$V_2 = Q_1/C_2 = C_1 V_B/C_2, \text{ where } Q_1 = Q_2$$

If it is assumed that $C_1$ is the maximum capacitance for the transducer 10, then $V_2$ is about the maximum voltage that could be produced by the electroactive polymer reservoir 90. When charge flows from transducer 10 after $t_2$, the voltage is lower than when no charge has flowed. This is because the charge flow takes charge away from transducer 10. As a result, the charge on transducer 10 would be less than $Q_1$. Thus, the voltage on transducer 10 would be reduced.

Charge removed from transducer 10 can be calculated by assuming a constant operational voltage $V_O$ which is between $V_B$ and the maximum voltage $V_2$ of the electroactive polymer reservoir 90. The electroactive polymer reservoir 90 of this invention is not limited to a constant $V_O$ and the example is provided for illustrative purposes only. When the operational $V_O$ voltage of the electroactive polymer reservoir 90 is assumed to be constant at the average of maximum $V_2$ and $V_B$ is:

$$V_O = \tfrac{1}{2}(V_2 + V_B) = \tfrac{1}{2}(C_1 V_B/C_2 + V_B), \text{ where } Q_1 = Q_2$$

The charge, $Q_o$ on the transducer 10 is $$C_2 V_O = \tfrac{1}{2} V_B (C_1 + C_2).$$

In this example, the charge, $Q_{Out}$ that passes through recovery element 65 between $t_1$ and $t_2$ is the difference between the charge at $t_1$, $Q_1$ and the charge after $t_2$, $Q_O$. This means that $Q_{Out}$ may be computed as follows $$Q_{Out} = Q_1 - Q_O = V_B(C_1 - C_2)/2$$

When the transducer 10 operates at a substantially constant frequency, f, the current $I_L$ delivered to the energy transmission device 86 or electric storage device 87 by the electroactive polymer reservoir 90 is, $$I_L = fQ_{Out} = fV_B(C_1 - C_2)/2$$

power $P_L$, delivered to the energy transmission device 86 or electric storage device 87, $$P_L V_O I_L = fV_O V_B(C_1 - C_2)/2$$

In the example above, the constant frequency, f is discussed for illustrative purposes only. Transducers of the present invention may operate at a constant frequency or a frequency that varies with time. Thus, the current, $I_L$ may also vary with time.

Electroactive Polymer Power Cycle—FIG. 6

The components of electroactive polymer expansion power cycle 100 includes pump 110, boiler 120 and boiler electroactive polymer reservoir 130, expansion electroactive polymer reservoir assembly 140 and condenser 150. Working fluid 20 flow through each of to complete a closed thermodynamic cycle.

FIG. 6 shows a preferred embodiment of a strain augmented power cycle 100. At the beginning of the cycle, working fluid 20 starts as a saturated liquid 22. Pump 110 then pressurizes saturated liquid 10 to a high-pressure compressed liquid 24 by input work 115. After leaving pump 110, compressed liquid 24 enters boiler 120. High temperature input thermal energy 125 enters boiler 120 and is transferred to compressed liquid 24 to produce high temperature and pressure vapor 26 at constant pressure. Compressed liquid 24, and high temperature and pressure vapor 26 exist at the same high pressure. High pressure and temperature vapor 26 exits boiler 120 and flows into and inflates boiler electroactive polymer reservoir 130. No additional heat or energy is transferred to or from high temperature and pressure vapor 26 during inflation of boiler electroactive polymer reservoir 130. When boiler electroactive polymer reservoir 130 reaches complete inflation input electrical energy 75 is transferred to boiler electroactive polymer reservoir 130, High temperature and pressure vapor 26 exits boiler electroactive polymer reservoir 130 and flows into expansion electroactive polymer reservoir assembly 140 wherein high temperature and pressure vapor 26 is at a reduced temperature and pressure. High temperature and pressure vapor 26 flows into expansion electroactive polymer reservoir assembly 140 and inflates the expansion reservoirs of electroactive polymer reservoir assembly 140. Input electric energy 75 is transferred to the inflated expansion reservoirs. Saturated vapor 28 exits electroactive polymer assembly 140 and flows into condenser 150. This results in deflation of boiler electroactive polymer 130 and expansion electroactive polymer reservoir assembly 140 expansion reservoirs. Output electrical energy 85 is transferred from the boiler electroactive polymer reservoir 130 and expansion electroactive polymer reservoir assembly 140 after returning to uninflated positions 92. Saturated liquid 22 exits condenser 150 and flows into pump 110 wherein working fluid 20 repeats the above cycle. Waste heat 126 flow from condenser 150 to the environment. Waste heat 126 is the heat that is removed from working fluid 20 during conversion from saturated vapor 28 to saturated liquid 22.

Sources of high temperature input thermal energy 125 can include but not limited to: fuel combustion, geothermal energy, solar energy, high temperature waste heat from industrial processes and exhaust from internal combustion engines.

Boiler Electroactive Polymer—FIG. 7A, FIG. 7B

FIG. 7A shows a cross section of boiler electroactive polymer reservoir 130 in uninflated position 92. Boiler electroactive polymer reservoir 130 includes in valve 96, cavity 132, that is enclosed by elastomeric wall 134, and exit valve 98. High temperature and pressure vapor 26 flows through in valve 96 into cavity 132 of boiler electroactive polymer reservoir 130. As high temperature and pressure vapor 26 flows into cavity 132, elastomeric wall 134 stretch until boiler electroactive polymer reservoir 130 reaches inflated position 94. Work is required to move elastomeric wall 132 from uninflated position 92 to inflated position 94. This work imposes strain energy in elastomeric wall 134.

FIG. 7B shows a cross section of boiler electroactive polymer reservoir 130 In inflated position 94, the energy contained within boiler electroactive polymer reservoir 130 is the sum of the total enthalpy contained within cavity 132 plus the strain energy contained within elastomeric wall 134. When boiler electroactive polymer reservoir 130 reaches inflated position 94, high pressure and temperature working fluid 26 flows from cavity 132 of boiler electroactive polymer reservoir 130 and boiler electroactive polymer reservoir 130 returns to the uninflated position 92.

During deflation of boiler electroactive polymer reservoir 130, the strain energy contained within elastomeric wall 134 transfers to high pressure and temperature vapor 26. The total energy flow from boiler electroactive polymer reservoir 130 during deflation is the sum of the strain energy in elastomeric walls 134 plus the total enthalpy of high temperature and pressure vapor 26. The strain energy pushes high temperature and pressure vapor 26 from cavity 132 in the form of kinetic energy.

Elastomeric wall 134 of boiler electroactive polymer reservoir 130, in uninflated position 92, as shown in FIG. 7A, is much thicker than elastomeric wall 134 of boiler electroactive polymer reservoir 130 as show FIG. 7B. This is because the elastomeric material is incompressible and as result, the elastomeric material does not change in volume. The volume of cavity 132 elastomeric reservoir 130 in inflated position 94 is much greater than the volume of cavity 132 in uninflated position 92. As a result, elastomeric wall 134 must stretch in order to enclose cavity 132 in inflated position 94. This means elastomeric walls 132 in inflated position 94 must be much thinner than wall 134 in uninflated position 92.

High temperature and pressure vapor 26 working fluid 20 exits boiler electroactive polymer reservoir 130 and enters expansion electroactive polymer reservoir assembly 140. Expansion electroactive polymer reservoir assembly 140 expands working fluid 20 from high temperature and pressure vapor 26 to saturated vapor 28. Working fluid 20 exits expansion electroactive polymer reservoir assembly 140 and enters condenser 150 as saturated vapor 28.

Working fluid 20 is a substance that can be converted to from a liquid to vapor through the addition of heat. Representative examples of working fluid 20 include but not limited to: water, ammonia, carbon dioxide, and organic fluids such as isobutane.

Expansion in Boiler Electroactive Polymer Reservoir and Expansion Electroactive Reservoir Assembly—FIGS. 8A, 8B, 8C, 8D FIG. 8A shows a representative example of boiler electroactive polymer reservoir 130 in inflated position 94 and expansion electroactive polymer reservoir assembly 140. In this example, expansion electroactive polymer reservoir assembly 140 includes two expansion electroactive polymer reservoirs, place in a series arrangement. These reservoirs include: First expansion reservoir 142, in uninflated position 92, and second expansion reservoir 144 in uninflated position 92. In the series arrangement working fluid 20 flow from boiler electroactive polymer reservoir 130 into first expansion reservoir 142. Working fluid 20 then flows into second expansion reservoir 144. Working fluid 20 flows from second expansion reservoir and exits expansion electroactive polymer reservoir assembly 140 as saturated vapor 28. Saturated vapor 28 flows from expansion electroactive polymer reservoir assembly 140 into condenser 50.

The configurations of the expansion reservoirs are substantially the same as boiler electroactive polymer reservoir 130 except that each expansion reservoir is designed to accept successively smaller masses of working fluid 20 at successively lower pressures and temperatures.

Described below is a representative example of the expansion process between boiler electroactive polymer reservoir 130 and expansion electroactive polymer reservoir assembly 140. This example describes three expansion steps. Other expansion processes could include only one expansion step, or more than the three expansion steps described below.

Boiler reservoir inflation work 136 is the work imposed on elastomeric wall 134 of boiler electroactive polymer reservoir 130. Boiler reservoir inflation work 136 is substantially reversible. This means when magnitude the work imposed, from high temperature and pressure vapor 26, on elastomeric wall 134 of boiler electroactive polymer reservoir 130 during inflation is equal in magnitude the work transferred from elastomeric wall 134 back to high temperature and pressure vapor 126 during deflation of boiler electroactive polymer reservoir 132.

First Working Fluid Expansion into the First Expansion Reservoir—FIG. 8B

FIG. 8B shows inflation of expansion reservoir 142 of expansion electroactive polymer reservoir assembly 140. Following inflation of boiler electroactive polymer reservoir 130, high temperature and pressure vapor 26 flows into first expansion reservoir 142 of expansion electroactive polymer reservoir assembly 140. This results in partial deflation of boiler electroactive polymer reservoir 130 and full inflation of first expansion reservoir 142. First expansion reservoir work 143 is the work imposed on elastomeric wall 134 of first expansion reservoir 142 from inflation. First expansion reservoir work 143 is substantially reversible and is equal in magnitude to the portion of boiler reservoir inflation work 136 that is transferred to first expansion reservoir 142 through high temperature and pressure vapor 26. After first expansion reservoir 142 is fully inflated, input electric energy 75 is transferred to first expansion reservoir 142.

The total mass of high temperature and pressure vapor 26 is contained within partially deflated boiler electroactive polymer reservoir 130 and inflated first expansion reservoir 142. The pressure and temperature of high temperature and pressure vapor 26, contained within boiler electroactive polymer reservoir 130 and first expansion reservoir 142, are reduced from the temperature and pressure of the fully inflated boiler electroactive polymer reservoir 130. When first expansion reservoir 142 is fully inflated, the strain energy density in elastomeric wall 134 of first expansion reservoir 142 is the same as the strain energy density in elastomeric wall 134 of boiler electroactive polymer reservoir 130 in inflated position 92. Strain energy density is defined as the total strain energy in a transduce wall divided by the mass of the transducer wall.

Second Working Fluid Expansion into the Second Expansion Reservoir FIG. 8C

FIG. 8C, describes the second expansion process. Following inflation of first expansion reservoir 142, high temperature and pressure vapor 26, at reduced temperature and pressure, flows into second expansion reservoir 144 of expansion electroactive polymer reservoir assembly 140. This results in additional partial deflation of boiler electroactive polymer reservoir 130, partial deflation of first expansion reservoir 142 and inflation of second expansion reservoir 144. Second expansion reservoir work 145 is the work imposed on elastomeric wall 134 of second expansion reservoir 144 from inflation. Second expansion reservoir work 145 is substantially reversible and is equal in magnitude to the portion of boiler reservoir inflation work 136 and the portion of first expansion reservoir work 143 that is transferred to second expansion reservoir 142 through high temperature and pressure vapor 26. After second expansion reservoir 144 is fully inflated, input electric energy 75 is transferred to second expansion reservoir 144.

The total mass of high temperature and pressure vapor 26 is contained within partially deflated boiler electroactive polymer reservoir 130, partially deflated first expansion reservoir 142, and inflated second expansion reservoir 144. The pressure and temperature of high temperature and pressure vapor 26, contained within boiler electroactive polymer reservoir 130, first expansion reservoir 142, and inflated second expansion reservoir 144 are reduced from the temperature and pressure of fully first expansion reservoir 142 and partially deflated boiler electroactive polymer reservoir 130. When second expansion reservoir 144 is fully inflated, the strain energy density in elastomeric wall 134 of second expansion reservoir 144 is the same as the strain energy density in elastomeric wall 134 of fully boiler electroactive polymer reservoir 130 and the strain energy density in elastomeric wall 134 of fully inflated first expansion reservoir 144.

Reservoir Deflation—FIG. 8D

FIG. 8D show deflation of a boiler electroactive polymer reservoir 130 and an expansion reservoir assembly 140. The final step in the expansion process is complete deflation. Complete deflation occurs after second expansion reservoir 144 reaches full inflation. High temperature and pressure and vapor 26, at the reduced temperature and pressure, flows from partially deflated boiler electroactive polymer reservoir 130, partially deflated first expansion reservoir 142 and inflated second expansion reservoir 144 and exits expansion electroactive polymer reservoir assembly 140. The remaining work from boiler reservoir inflation work 136, first expansion reservoir 142, and the second expansion reservoir work 144 pushes the reduced temperature and pressure of the high temperature and pressure vapor 28 from expansion electroactive polymer reservoir assembly 140. The working fluid 20 exits expansion electroactive polymer reservoir assembly 140 and expands to saturated vapor 28. Saturated vapor 28 exits expansion electroactive polymer reservoir assembly 140 and flows into condenser 150. After complete deflation, output electrical energy 85 is transferred form transducers 10 of boiler electroactive polymer reservoir 140, first expansion reservoir 142, and second expansion reservoir 144.

Condenser 150 removes heat from saturated vapor 28 and converts saturated vapor to saturated liquid 22. Saturated liquid 22 exits condenser and flows into pump 110. Input work 115 flows to pump 110 wherein pump 110 pressurizes saturated liquid 22 to compressed liquid 24. Working fluid 20 then repeats electroactive polymer expansion power cycle 100.

Electricity Generation

The energy recovery cycle to generate electricity, described above in FIG. 2 is used to generate electricity from the inflation and deflation of boiler electroactive polymer reservoir 130 and the expansion reservoirs of expansion electroactive polymer reservoir assembly 140. When boiler electroactive polymer reservoir 130 reaches inflated position 94, input electrical energy 75 low voltage charge 70 is transferred to transducer 10 of boiler electroactive polymer reservoir 140. When first expansion reservoir 142 of expansion electroactive polymer reservoir assembly 140 reaches inflated position 94, input electrical energy 75 low voltage charge 70 is transferred to transducer 10 of first expansion reservoir 142. When second expansion reservoir 144 of expansion electroactive polymer reservoir assembly 140 reach full inflated position 94, input electrical energy 75 low voltage charge 70 is transferred to transducer of second expansion reservoir 144.

The electric charge remains constant on transducer 10 of boiler electroactive polymer reservoir 130 the during partial deflations required to inflate first expansion reservoir 142 and second expansion reservoir 144. In addition, the electric charge remains constant on transducer 10 of first expansion reservoir 142 during the partial deflation required to inflate second expansion reservoir 144. And finally, the electric charges remain constant on transducers 10 of boiler electroactive polymer reservoir 130, first expansion reservoir 142 and second expansion reservoir 144 when the reservoirs are fully deflated.

After boiler electroactive polymer reservoir 130, first expansion reservoir 142, and second expansion reservoir 144 are fully deflated, output electrical energies 85 from transducers 10 are removed from the transducers as described above.

CONCLUSIONS, RAMIFICATIONS, AND SCOPE OF INVENTION

Accordingly, the reader will see that the electroactive polymer expansion power cycle, of this invention, can be used generate electrical energy from thermal energy contained in the high temperature and pressure working fluid of the power cycle. Thus, this invention can be used to generate electricity by the embodiments, describe herein, that stretch and relax transducers, in electroactive polymer reservoirs, with electric charges in a way that generates electricity. These embodiments can include but are not limited to application of boiler electroactive polymer reservoirs and expansion electroactive reservoirs. Thus, a low-cost means is provided for electricity generation capability thermal energy. In addition, a low-cost means is provided for generating electrical energy from thermal energy contained in pressurized vapor. Furthermore, electroactive polymer expansion power cycle has additional advantages in that:
it provides a means for changing a transducer from a relaxed state to at stretched by inflating an electroactive polymer reservoir wherein a high-pressure vapor working fluid flows into the electroactive polymer reservoir;
it provides a charge exchange means for transferring a low voltage electric charge from conditioning electronics to the transducer in the stretched state;
it provides a means for expanding a high-pressure vapor, in an inflated electroactive polymer reservoir, to a low-pressure vapor by allowing deflation of the electroactive polymer reservoir, causing the transducer to return the relaxed state thereby transforming the low voltage electric charge to a high voltage electric charge;
it provides a charge exchange means for transferring the high voltage electric charge from the relaxed transducer to the conditioning electronics.

The transducers of the electroactive polymer reservoirs can be of a spherical configuration, a hemispherical configuration, a cylindrical configuration, or a hemicylindrical configuration. In the spherical configuration, the transducer wall encloses a spherical cavity. In the hemispherical configuration, the transducer wall encloses a hemispherical cavity. In the cylindrical configuration, the transducer wall encloses a cylindrical cavity and in the hemicylindrical configuration the transducer wall encloses a hemicylindrical cavity.

Although the description above contains many specificities these should not be construed as limiting the scope of the invention but merely providing illustrations of some of the presently preferred embodiments of this invention.

I claim:

1. A closed thermodynamic cycle for conversion of thermal energy contained in a working fluid, directly to electrical energy, said closed thermodynamic cycle wherein the improvement comprises:
   a. one or more electrical generators comprising at least one cavity wherein said cavity is formed by electricity generating transducers, configured for expanding a gaseous working fluid from a first pressure to a second pressure, each transducer comprising one or more pairs of electrodes and one or more polymer spacers sandwiched between one or more pairs of electrodes in a configuration that causes a change in electric field in response to said working fluid flowing from the cavity and causing the cavity to deflect from a first position to a second position; and
   b. one or more charge elements designed or configured to transfer electrical energy to said one or more pairs of electrodes when said electricity generating transducers are deflected to said first position; and
   c. one or more recovery elements designed or configured to transfer electrical energy from said one or more pair of electrodes when the electricity generating transducers are deflected to said second position; and
   d. one or more condensers, which receives the working fluid from the one or more electrical generators, configured to condense the working fluid from a vapor state to a liquid state; and
   e. at least one pump, which receives said liquid state working fluid from said condenser, configured to pressurize the liquid state working fluid from a lower pressure to a higher pressure wherein said lower pressure is below or the same as to the second pressure and the higher pressure the same as or higher than to the first pressure; and
   f. at least one boiler, which receives said pressurized working fluid from the pump, configured to vaporize the working fluid, at the first pressure, to a vapor state using an external heat source; and
   g. the one or more electrical generators which receives the working fluid, in said vapor state, from said boiler.

2. The closed thermodynamic cycle of claim 1 wherein said one or more polymer spacers comprises an elastomeric polymer wherein said elastomeric polymers may be comprised of one or more materials including but not limited to: silicone elastomers, thermoplastic elastomers, acrylic elastomers, polyurethanes or fluoroelastomers.

3. The closed thermodynamic cycle of claim 1 wherein said one or more pairs of electrodes comprises an elastomeric electrically conductive material or a conductive grease.

4. The closed thermodynamic cycle of claim 1 wherein said external heat source includes one or more sources but not limited to: fuel combustion, geothermal energy, solar energy, high temperature waste heat from industrial processes and exhaust from internal combustion engines.

5. The electrical generator of claim 1 comprises a spherical cavity enclosed by said electricity generating transducer.

6. The electrical generator of claim 1 comprises a hemispherical cavity enclosed by said electricity generating transducer.

7. The electrical generator of claim 1 comprises a cylindrical cavity enclosed by said electricity generating transducer.

8. The electrical generator of claim 1 comprises a hemicylindrical cavity enclosed by said electricity generating transducer.

9. A method for conversion of thermal energy contained in a working fluid directly to electricity, said thermal energy conversion method provides:
   a. one or more electrical generator means wherein each electrical generator comprising at least one cavity wherein said cavity is formed by electricity
   b. generating transducers, configured for expanding a gaseous working fluid from a first pressure to a second pressure, each transducer comprising one or more pairs of electrodes and one or more polymer spacers sandwiched between one or more pairs of electrodes in a configuration that causes a change in electric field in response to said working fluid flowing from the cavity and causing the cavity to deflect from a first position to a second position; and
   c. one or more charge means that provides for charge elements designed or configured to transfer electrical energy to said one or more pairs of electrodes when said electricity generating transducers are deflected to said first position; and
   d. one or more recovery means that provides for one or more recovery elements designed or configured to transfer electrical energy from said one or more pair of electrodes when the electricity generating transducers are deflected to said second position; and
   e. one or more condensers means wherein each condenser receives working fluid from the one or more electrical generators, configured to condense the working fluid from a vapor state to a liquid state; and
   f. at least one pump means wherein each pump receives said liquid state working fluid from said condenser, configured to pressurize the liquid state working fluid from a lower pressure to a higher pressure wherein said lower pressure is below or the same as the second pressure and the higher pressure is the same as or above to the first pressure; and
   g. at least one boiler means, wherein each boiler receives said pressurized working fluid from the pump, configured to vaporize the working fluid, at the first pressure, to a vapor state using an external heat source; and
   h. the one or more electrical generator means wherein each electrical generator receives the working fluid, in said vapor state, from the toiler.

10. The method of claim 9 wherein said one or more polymer spacers means comprises an elastomeric polymer wherein said elastomeric polymer may be comprised of one or more materials including but not limited to: silicone elastomers, thermoplastic elastomers, acrylic elastomers, polyurethanes and fluoroelastomers.

11. The method of claim 9 wherein said one of more pairs of electrodes comprises an elastomeric electrically conductive material or a conductive grease.

12. The method of claim 9 wherein said external heat source includes one or more sources but not limited to: fuel combustion, geothermal energy, solar energy, high temperature waste heat from industrial processes and exhaust from internal combustion engines.

13. The method of claim 9 wherein electrical generator means comprises a spherical cavity enclosed by said electricity generating transducer.

14. The method of claim 9 wherein electrical generator means comprises a hemispherical cavity enclosed by said electricity generating transducer.

15. The method of claim 9 wherein electrical generator means comprises a cylindrical cavity enclosed by said electricity generating transducer.

16. The method of claim 9 wherein electrical generator means comprises a hemicylindrical cavity enclosed by said electricity generating transducer.

* * * * *